United States Patent
Lu

(10) Patent No.: US 7,876,142 B2
(45) Date of Patent: Jan. 25, 2011

(54) LATCH INVERTER AND FLIP-FLOP USING THE SAME

(75) Inventor: Chao-Hsin Lu, Tao Yuan County (TW)

(73) Assignee: Realtek Semiconductor Corp., Hsinchu (TW)

( * ) Notice: Subject to any disclaimer, the term of this patent is extended or adjusted under 35 U.S.C. 154(b) by 141 days.

(21) Appl. No.: 11/200,209

(22) Filed: Aug. 10, 2005

(65) Prior Publication Data

US 2006/0033543 A1  Feb. 16, 2006

(30) Foreign Application Priority Data

Aug. 13, 2004  (TW) ............... 93124480 A

(51) Int. Cl.
*H03K 3/00* (2006.01)
(52) U.S. Cl. ............................................ 327/218
(58) Field of Classification Search ......... 327/201–203, 327/208–212, 217–221
See application file for complete search history.

(56) References Cited

U.S. PATENT DOCUMENTS

| | | | | |
|---|---|---|---|---|
| 4,571,504 A | * | 2/1986 | Iwamoto et al. | 327/206 |
| 6,211,713 B1 | * | 4/2001 | Uhlmann | 327/211 |
| 6,563,270 B1 | * | 5/2003 | Koyama | 315/169.1 |
| 6,621,318 B1 | * | 9/2003 | Burr | 327/218 |
| 6,895,061 B1 | * | 5/2005 | Stong | 375/354 |

* cited by examiner

*Primary Examiner*—Lincoln Donovan
*Assistant Examiner*—Khareem E Almo
(74) *Attorney, Agent, or Firm*—Thomas, Kayden, Horstemeyer & Risley, LLP

(57) ABSTRACT

A latch inverter includes a first PMOS transistor, a second PMOS transistor, a first NMOS transistor, a second NMOS transistor, a first level-adjusting unit and a second level-adjusting unit. The first level-adjusting unit changes the voltage level of the source of the second PMOS transistor in advance, and the second level-adjusting unit changes the voltage level of the drain of the second NMOS transistor in advance.

18 Claims, 9 Drawing Sheets

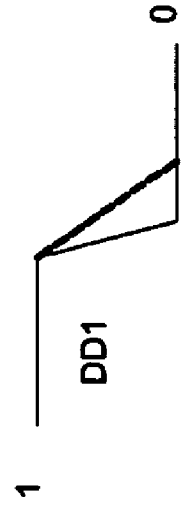
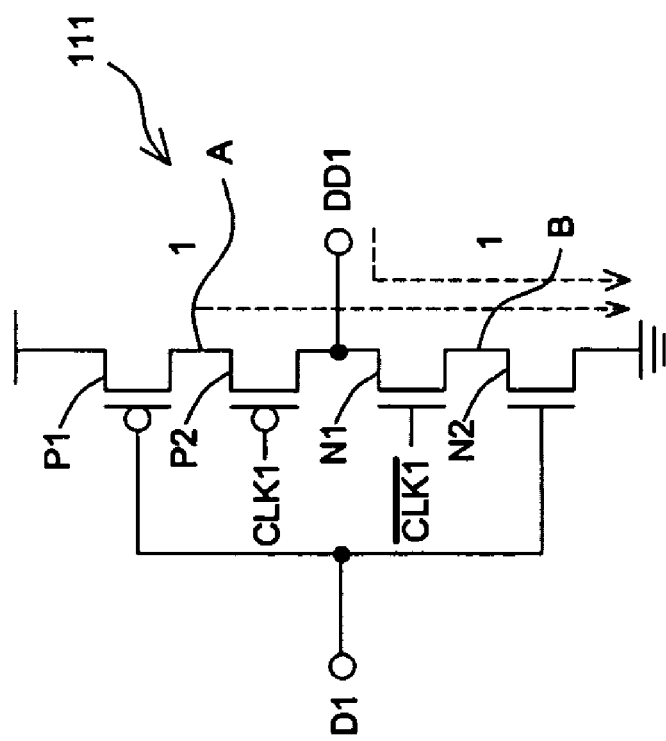
FIG. 6 (PRIOR ART)
FIG. 5 (PRIOR ART)

US 7,876,142 B2

LATCH INVERTER AND FLIP-FLOP USING THE SAME

CROSS REFERENCE OF RELATED APPLICATION

This application claims the benefit of the filing date of Taiwan Application Ser. No. 093124480, filed on Aug. 13, 2004, the content of which is incorporated herein by reference.

BACKGROUND OF THE INVENTION (a) Field of the Invention

The invention relates to electronic circuits, and more particularly, to latch inverters and flip-flops using the same.

(b) Description of the Related Art

FIG. 1A shows a typical double latch data flip-flop (DDFF) 10. A typical DDFF 10 receives two input signals D1 and D2, and two trigger clocks CLK1 and CLK2, to generate an output signal Dout. During the rising edge of the trigger clock CLK1, the state of the input signal D1 is selected as the state of the output signal Dout in the DDFF 10; while during the rising edge of the trigger clock CLK2, the state of the input signal D2 is selected as the state of the output signal Dout in the DDFF 10. Hence, two separate parallel data can be merged into one serial data output through the use of the DDFF 10.

FIG. 1B shows a circuit illustrating a conventional DDFF 10, which includes four latch inverters 111, 112, 113, 114, a buffer 12, and two latches 13, 13'. The first latch inverter 111 receives a first data signal D1 and a trigger clock CLK1, and generates a first latch signal DD1. As the voltage level of the trigger clock CLK1 is low, the voltage level of the first latch signal DD1 becomes the inverted voltage level of the D1. The third latch inverter 113 receives the first latch signal DD1 and the trigger clock CLK1, and generates a third trigger clock DD3. As the voltage level of the trigger clock CLK1 is high, the voltage level of the third trigger clock DD3 becomes the inverted voltage level of the first latch signal DD1, namely the voltage level of the first data signal D1. The operations of the second latch inverter 112 and the fourth latch inverter 114 are similar to those of the first latch inverter 111 and the third latch inverter 113, except that the trigger clock received by the second latch inverter 112 and the fourth latch inverter 114 is the trigger clocks CLk2. In common use, the trigger clock CLK2 is the inverted version of the trigger clock CLK1.

The latches 13 and 13' are used to maintain the voltage levels of the first latch signal DD1 and the second latch signal DD2. The buffer 12 receives the third latch signal DD3 and the fourth latch signal DD4 and generates an output signal Dout.

Through the alternation of the falling edge and the rising edge of the trigger clock CLK1, the DDFF 10 may superpose the two data signals D1 and D2 and output the output signal Dout whose frequency value is doubled. The relation between the input and the output of the DDFF 10 is shown in FIG. 2.

FIG. 3 is a schematic view illustrating the phenomenon seen in the latch inverters during the rising edge of the output signal, where the latch inverter 111 is shown as an example. Referring to FIG. 3, a node A is defined between the drain of a first PMOS transistor P1 and the source of a second PMOS transistor P2. A node B is defined between the source of a first NMOS transistor N1 and the drain of the second NMOS transistor N2. In a first instance when the voltage level of the node B is 0 and the voltage level of the latch signal DD1 is to be changed from 0 to 1, both the node B and the latch signal DD1 need to be charged to voltage level 1 by the supply voltage. A dash line shown in FIG. 4 indicates this voltage level change of the latch signal DD1 in the latch inverter 111. On the other hand, in a second instance when the voltage level of the node B is 1 and the voltage level of the latch signal DD1 is to be changed from 0 to 1, only the latch signal DD1 needs to be charged to voltage level 1 by the supply voltage. A solid line shown in FIG. 4 indicates this voltage level change of the latch signal DD1 in the latch inverter 111. Therefore, the slew rate in the first instance is different from the slew rate in the second instance.

FIG. 5 is a schematic view illustrating a phenomenon seen in the latch inverters during the falling edge of the output signal, where the latch inverter 111 is shown as an example. The locations of the nodes A and B shown in FIG. 5 are the same as those shown in FIG. 3. In a third instance when the voltage level of the node A is 1 and the voltage level of the latch signal DD1 is to be changed from 1 to 0, both the node A and the latch signal DD1 need to be discharged to voltage level 0 by the second NMOS transistor N2. A dash line shown in FIG. 6 indicates this voltage level change of the latch signal DD1 in the latch inverter 111. On the other hand, in a fourth instance when the voltage level of the node A is 0 and the voltage level of the latch signal DD1 is to be changed from 1 to 0, only the latch signal DD1 needs to be discharged to voltage level 0 by the second NMOS transistor N2. A solid line shown in FIG. 6 indicates this voltage level change of the latch signal DD1 in the latch inverter 111. Therefore, the slew rate in the third instance is different from the slew rate in the fourth instance.

As shown above, for these latch inverters, the slew rate of the latch signals is different for different instances of state change. This may caused data jitter in the output signals Dout of the double latch data flip-flop 10, and worsen data transmission quality.

BRIEF SUMMARY OF THE INVENTION

In view of the above-mentioned problems, an object of the invention is to provide a latch inverter having an improved response speed.

Another object of the invention is to provide a double latch data flip-flop, in which the fluctuation of slew rate for different instances of state change is diminished.

To achieve the above-mentioned object, a latch inverter includes a first PMOS transistor, a second PMOS transistor, a first NMOS transistor, a second NMOS transistor, a first level-adjusting unit and a second level-adjusting unit. The gate of the first PMOS transistor receives a data signal and the source of the first PMOS transistor is connected to a voltage source. The gate of the second PMOS transistor receives a first trigger clock, and the source of the second PMOS transistor is connected to the drain of the first PMOS transistor. The gate of the first NMOS transistor receives a second trigger clock, and the drain of the first NMOS transistor is connected to the drain of the second PMOS transistor. The gate of the second NMOS transistor receives the data signal, the drain of the second NMOS transistor is connected to the source of the first NMOS transistor, and the source of the second NMOS transistor is grounded. The first level-adjusting unit is connected between the drain of the first PMOS transistor and the source of second PMOS transistor (at a first node) to maintain the voltage level of the first node at 0, so that the response speed of the latch inverter is elevated. The second level-adjusting unit is connected between the drain of the first NMOS transistor and the source of the second NMOS transistor (at a second node) to maintain the voltage level of the second node at 1, so that the response speed of the latch inverter is elevated.

BRIEF DESCRIPTION OF THE DRAWINGS

FIG. 5 is a schematic view illustrating a phenomenon seen in a conventional latch inverter during the falling edge of an output latch signal.

FIG. 6 shows a waveform diagram of a conventional latch inverter during the falling edge of an output latch signal.

DETAILED DESCRIPTION OF THE INVENTION

The latch inverter and the flip-flop incorporating the latch inverter according to the invention will be described with reference to the accompanying drawings.

Figure 1A:
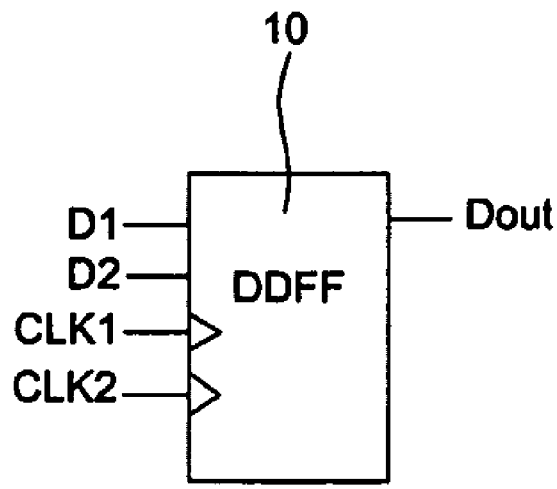
FIG. 1A shows a conventional double latch data flip-flop.
Figure 1B:
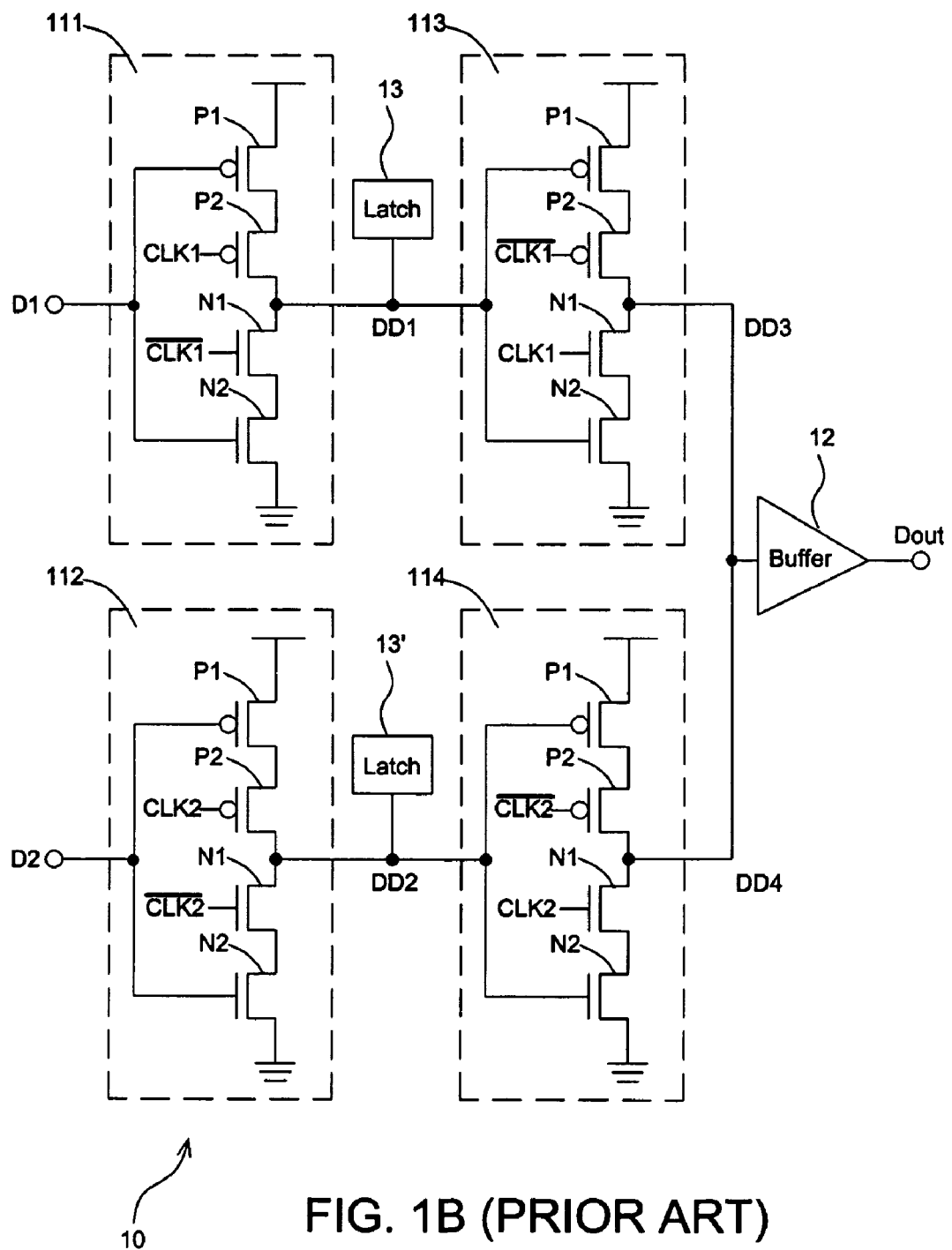
FIG. 1B shows a circuit architecture illustrating a conventional double latch data flip-flop.
Figure 2:
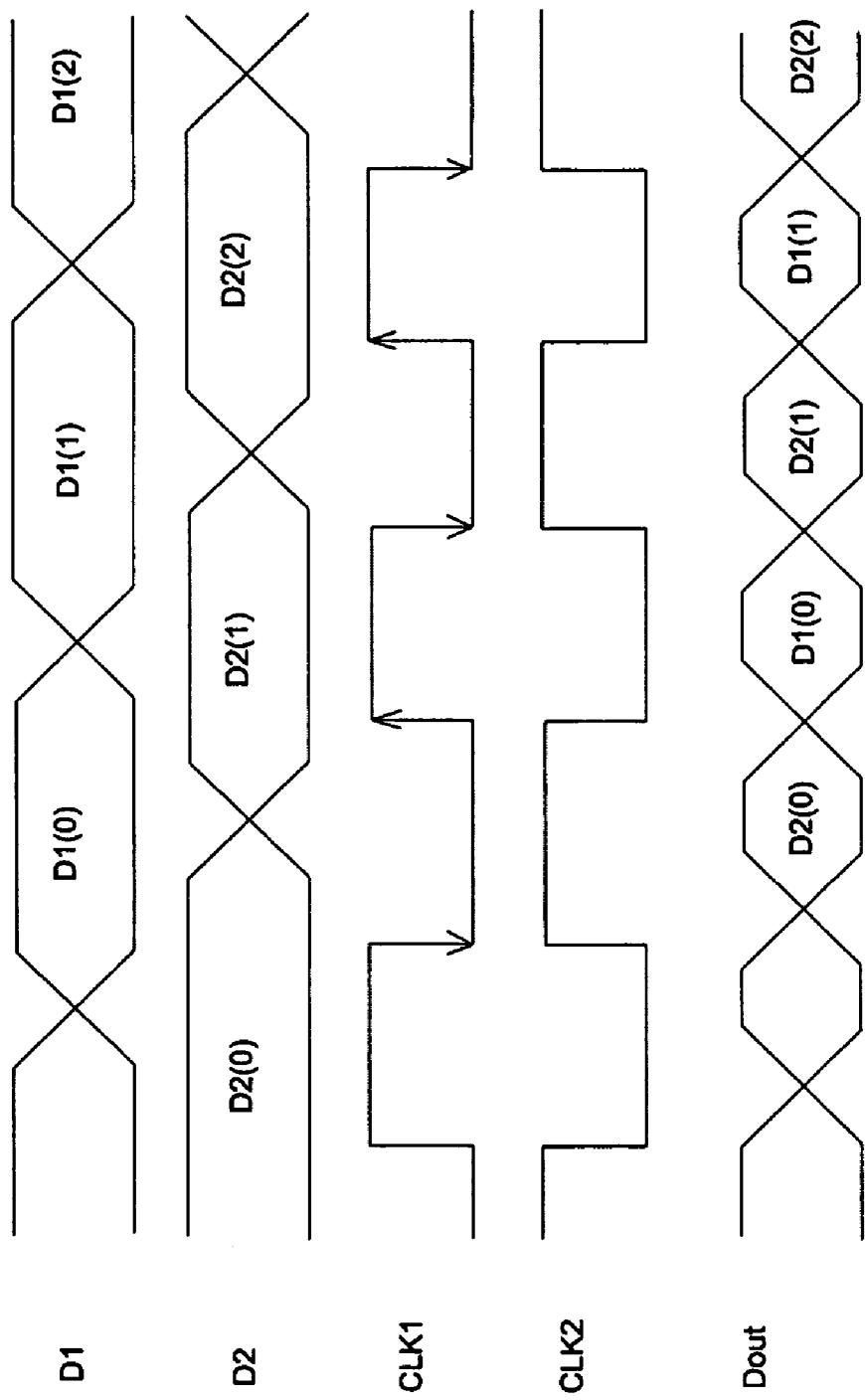
FIG. 2 shows a waveform diagram illustrating the relation between the input and the output of the double latch data flip-flop.
Figure 4:
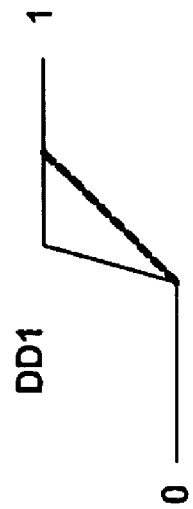
FIG. 4 shows a waveform diagram of a conventional latch inverter during the rising edge of an output latch signal.
Figure 3:
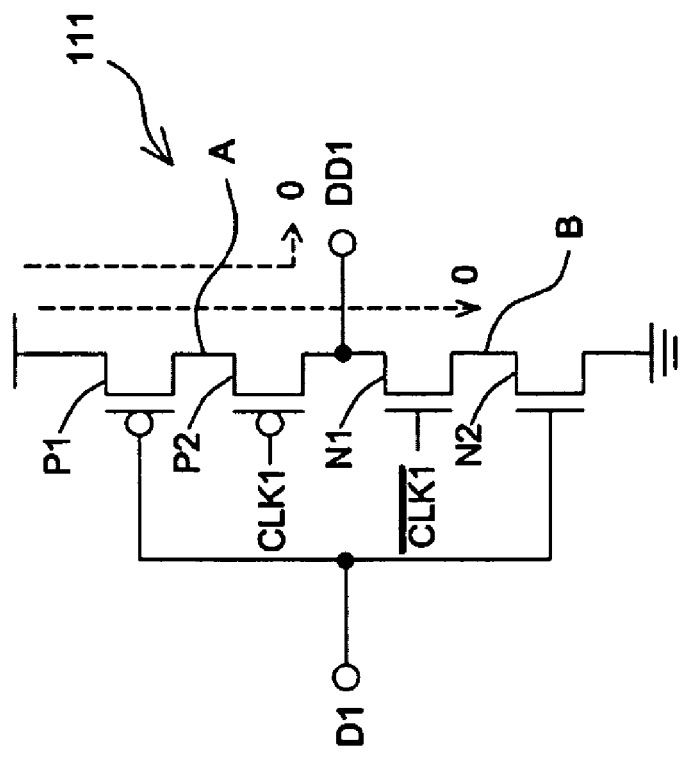
FIG. 3 is a schematic view illustrating a phenomenon seen in a conventional latch inverter during the rising edge of an output latch signal.
Figure 7:
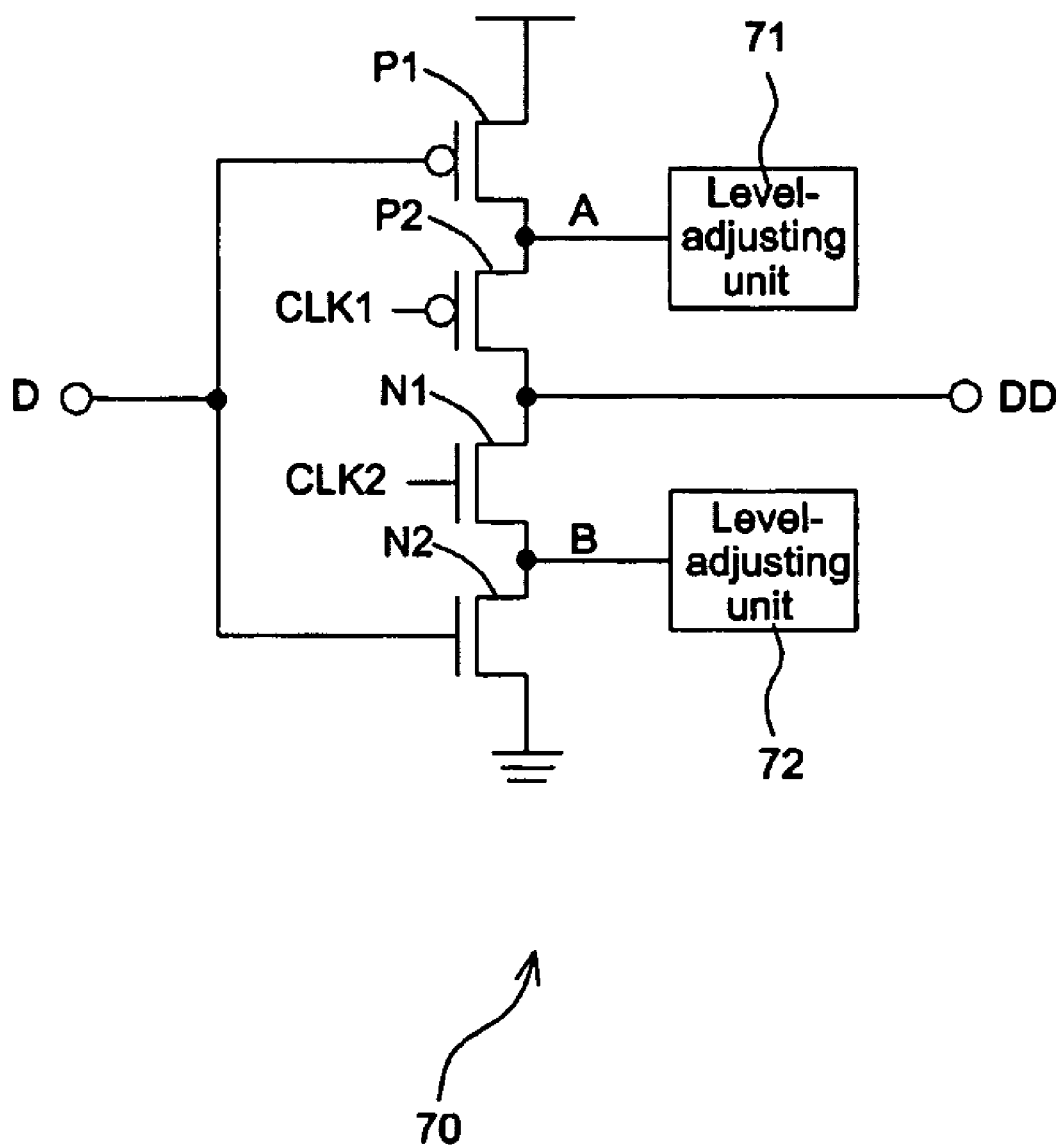
FIG. 7 shows a schematic view illustrating a latch inverter according to an embodiment of the invention.

FIG. 7 shows a schematic view illustrating a latch inverter according to an embodiment of the present invention. The latch inverter 70 includes a first PMOS transistor P1, a second PMOS transistor P2, a first NMOS transistor N1, a second NMOS transistor N2, a first level-adjusting unit 71, and a second level-adjusting unit 72. In this embodiment, the first level-adjusting unit 71 is coupled to a node A between the first PMOS transistor P1 and the second PMOS transistor P2. The second level-adjusting unit 72 is coupled to a node B between the first NMOS transistor N1 and the second NMOS transistor N2. Typically but not serving as limitation, the second trigger clock CLK2 is the inverted version of the first trigger clock CLK1.

The connection and the operation of the latch inverter 70 associated with the state of the data signal D is described as the following. In this embodiment, the second trigger clock CLK2 is the inverted version of the first trigger clock CLK1.

Scenario 1: when the voltage level of the data signal D is HIGH, the second NMOS transistor N2 is on, and at this time the first level-adjusting unit 71 changes the voltage level of the node A to LOW in advance. Then, when the voltage level of the first trigger clock CLK1 is LOW and the voltage level of the second trigger clock CLK2 is HIGH, the second PMOS transistor P2 and the first NMOS transistor N1 are both on, and thus the voltage level of the latch signal DD becomes LOW because DD is grounded through the first and the second NMOS transistors N1 and N2. Since the voltage level of the node A becomes LOW in advance, the node A no longer needs to be discharged through the first and the second NMOS transistors N1 and N2, and as a result the voltage level of the data signal DD is promptly changed to LOW.

Scenario 2: when the voltage level of the data signal D is LOW, the first PMOS transistor P1 is on, and at this time the second level-adjusting unit 72 changes the voltage level of the node B to HIGH in advance. Then, when the voltage level of the first trigger signal CLK1 is LOW and the voltage level of the second trigger signal CLK2 is HIGH, the second PMOS transistor P2 and the first NMOS transistor N1 are both on, and thus the voltage level of the latch signal DD becomes HIGH because DD is coupled to a positive supply voltage through the first PMOS transistor P1 and the second PMOS transistor P2. Since the voltage level of the node B becomes HIGH in advance, the node B no longer needs to be charged through the first and the second PMOS transistors P1 and P2, and as a result the voltage level of the latch signal DD is promptly changed to HIGH.

In this embodiment, since the voltage levels of the node A and the node B are preset by the level-adjusting units 71 and 72, the response speed of the latch inverter 70 is elevated, and the data jitter of the latch signal DD is eliminated to result in stable data transmission.

Figure 8:
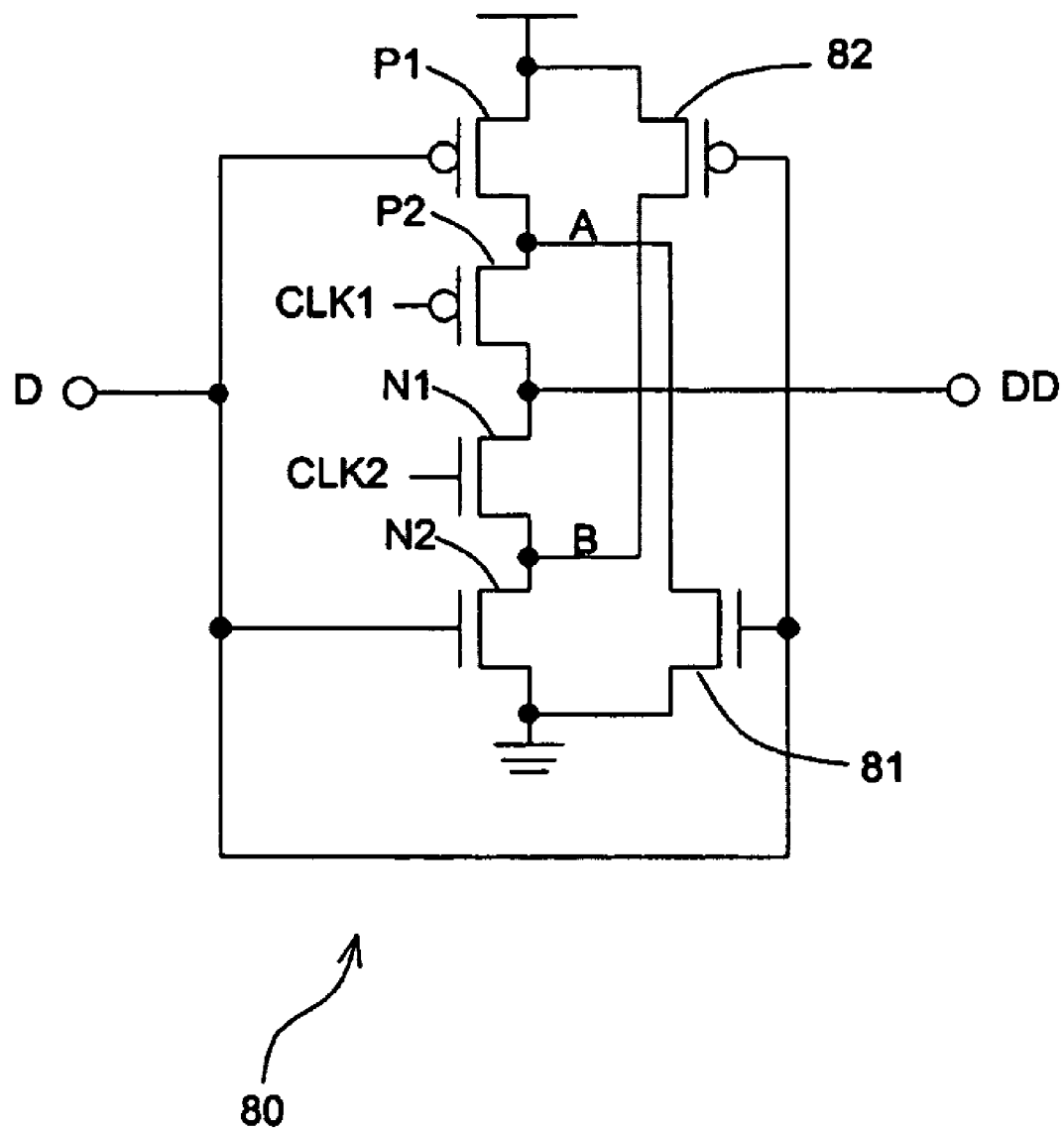
FIG. 8 shows a circuit diagram of a latch inverter according to an embodiment of the invention.

FIG. 8 shows a circuit diagram of a latch inverter 80 according to an embodiment of the invention. Referring to FIG. 8, the level-adjusting units 71 and 72 in FIG. 7 are implemented by a NMOS transistor 81 and a PMOS transistor 82. The gate of the NMOS transistor 81 receives the data signal D, its drain is connected to the node A, and its source is grounded. The gate of the PMOS transistor 82 receives the data signal D, its source is connected to a voltage source, and its drain is connected to the node B. The circuit architecture and operation of the latch inverter 80 is similar to those of the latch inverter 70, and detailed description is thus omitted.

Figure 9:
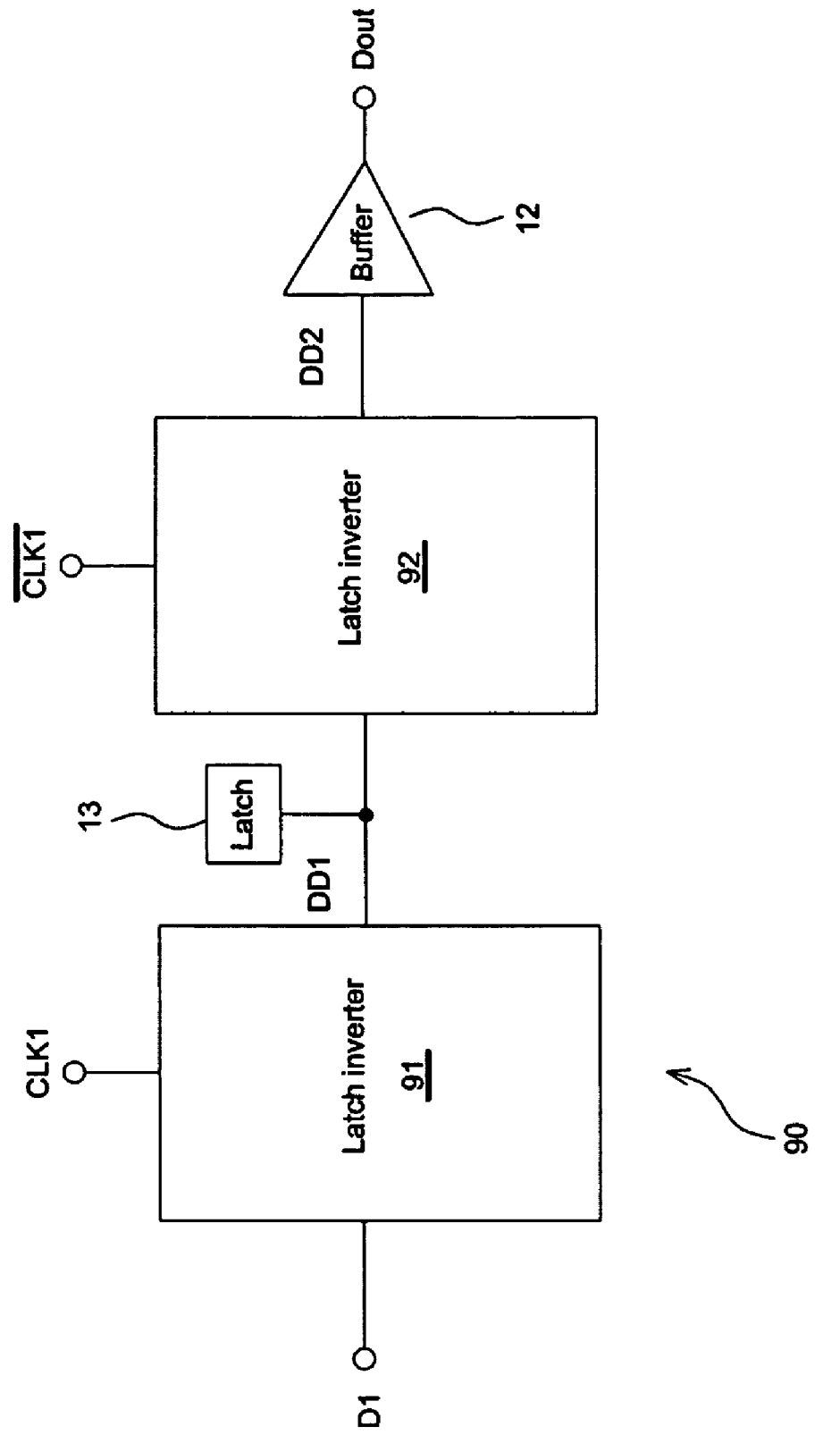
FIG. 9 shows an embodiment circuit diagram illustrating a flip-flop incorporating the inventive latch inverters.

FIG. 9 shows an embodiment circuit diagram of a flip-flop incorporating the inventive latch inverters. The flip-flop 90 includes two latch inverters 91 and 92 and a latch 13. The latch inverter 91 receives a first data signal D1 and a trigger clock CLK1 and generates a first latch signal DD1. When the voltage level of the trigger clock CLK1 is LOW, the voltage level of the first latch signal DD1 is changed to the inverted voltage level of the first data signal D1. The latch inverter receives the first latch signal DD1 and an inverted version of the trigger clock CLK1 and generates a second latch signal DD2. When the voltage level of the trigger clock CLK1 is HIGH, the voltage level of the second latch signal DD2 is changed to the inverted voltage level of the first latch signal DD1. The buffer 12 receives the second latch signal DD2 and generates an output signal Dout, and the latch 13 maintains the voltage level of the first latch signal DD1. In this embodiment, the latch inverters 91 and 92 are connected in the flip-flop 90 to form a two-stage cascade. The latch converters 91 and 92 both have a high response speed in the data transmission to ensure the flip-flop 90 incorporating them to have the same high response speed. Note that the flip-flop may be also designed to have only one stage such as the rear stage be provided with the level-adjusting unit.

Figure 10:
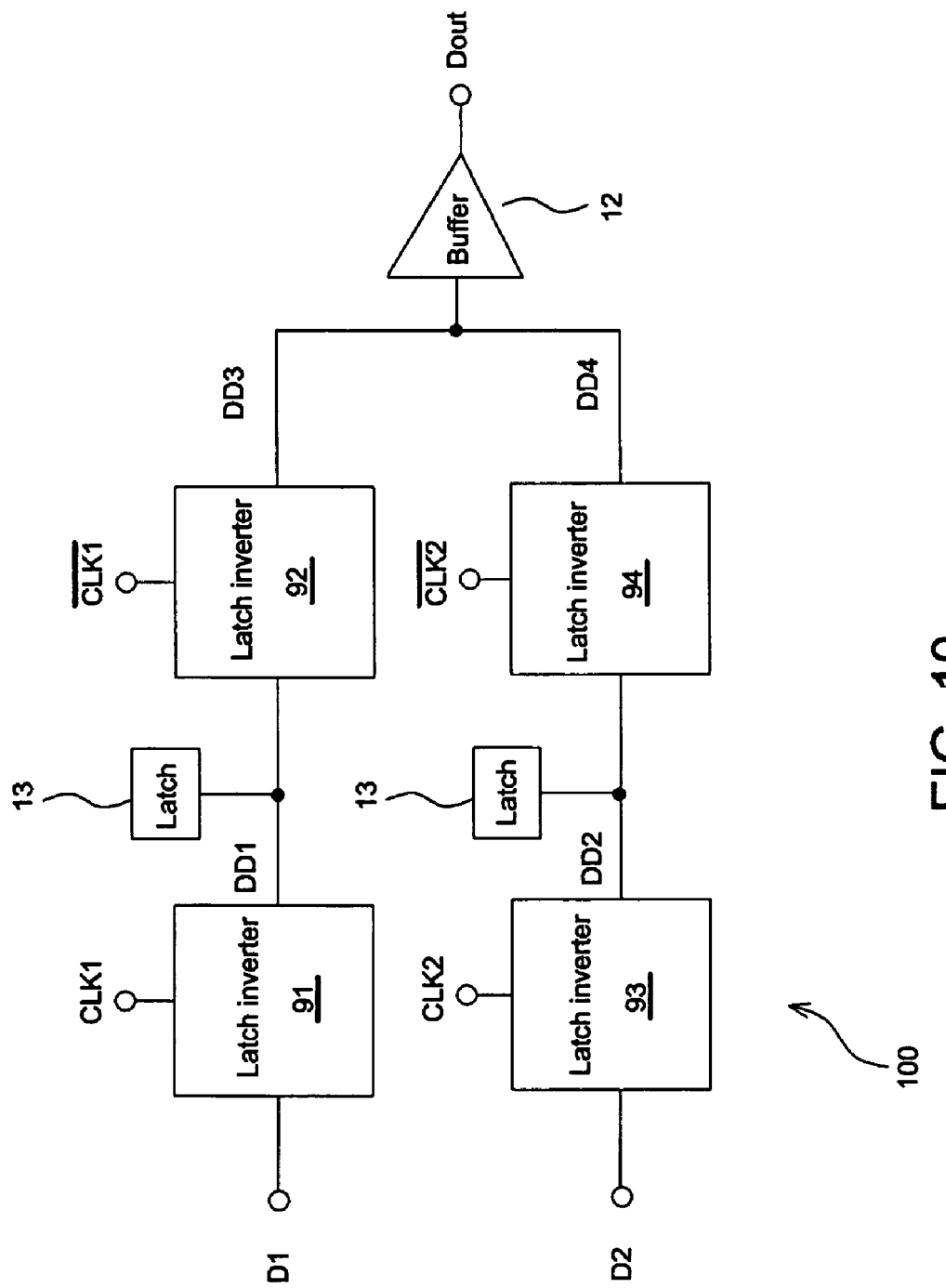
FIG. 10 shows an embodiment circuit diagram illustrating a double latch data flip-flop incorporating the inventive latch inverters.

FIG. 10 shows a circuit diagram illustrating an embodiment double latch data flip-flop (DDFF) incorporating the inventive latch inverters. The DDFF 100 includes four latch converters 91, 92, 93 and 94, a buffer 12 and two latches 13. Referring to FIG. 10, the latch inverters 91 and 92 output signals according to the trigger clock CLK1, and the latch inverters 93 and 94 output signals according to the trigger clock CLK2. The trigger clock CLK2 may be the inverted version of the trigger clock CLK1.

During the rising edge of the trigger clock CLK1, the state of the input signal D1 is selected as the state of the output signal Dout in the DDFF 100, while the state of the input signal D2 is selected as the state of the output signal Dout in the DDFF 100 during the rising edge of the trigger clock CLK2. Hence, as the trigger clock CLK2 being the inverted signal of the trigger clock CLK1, by means of the DDFF 100 the two parallel data signals D1 and D2 can be merged into one serial data output Dout with doubled frequency. Since the latch inverters have a high response speed in the data transmission, the DDFF 100 incorporating them also becomes a flip-flop having the same high response speed. Note that the DDFF 100 may be also designed to have only one stage such as the rear stage be provided with the level-adjusting unit.

As described above, since the level-adjusting unit allows for adjusting the voltage levels of the transistors in the latch inverter, the latch inverters, the flip-flop and the DDFF incorporating them are all improved in the response speed of the data transmission. It is also to be noted that although the level-adjusting units 71, 72 is exemplified as transistors 81, 82 configured in FIG. 8, one of ordinary skill in the art should be able to adopt similar or different circuit components with various configurations into the level-adjusting units in view of the disclosure, as long as such adoption does not deviate from the spirit of the invention.

While the invention has been described by way of examples and in terms of the preferred embodiments, it is to be understood that the invention is not limited to the disclosed embodiments. To the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A latch inverter, comprising:
a first transistor, the gate of the first transistor receiving a data signal and the source of the first transistor connected to a voltage source;
a second transistor, the gate of the second transistor receiving a first trigger clock and the source of the second transistor connected to the drain of the first transistor;
a third transistor, the gate of the third transistor receiving a second trigger clock and the drain of the third transistor directly connected to the drain of the second transistor to generate an output signal;
a fourth transistor, the gate of the fourth transistor receiving the data signal, the drain of the fourth transistor directly connected to the source of the third transistor, and the source of the fourth transistor being grounded;
a fifth transistor, the gate of the fifth transistor receiving the data signal, the drain of the fifth transistor connected to the source of the second transistor, and the source of the fifth transistor being grounded; wherein the fifth transistor is used for providing the source of the second transistor with a first logic level;
a sixth transistor, the gate of the sixth transistor receiving the data signal, the source of the sixth transistor connected to a voltage source, and the drain of the sixth transistor connected to the drain of the fourth transistor; wherein the sixth transistor is used for providing the drain of the fourth transistor with a second logic level;
wherein the drain of the fifth transistor and the drain of the sixth transistor are separated, and wherein the first and second trigger clocks are independent of the output signal.

2. The latch inverter as claimed in claim 1, wherein the second trigger clock is the inverted signal of the first trigger clock.

3. The latch inverter as claimed in claim 1, wherein the first and the second transistors are PMOS transistors, and the third and the fourth transistors are NMOS transistors.

4. The latch inverter as claimed in claim 1, wherein the first logic level is changed to Low by the fifth transistor when the voltage level of the data signal corresponds to the logic HIGH.

5. The latch inverter as claimed in claim 1, wherein the fifth transistor is a NMOS transistor.

6. The latch inverter as claimed in claim 1, wherein the second logic level is changed to HIGH by the sixth transistor when the voltage level of the data signal corresponds to logic LOW.

7. The latch inverter as claimed in claim 1, wherein the sixth transistor is a PMOS transistor.

8. The latch inverter as claimed in claim 1, wherein the latch inverter is applied to a flip-flop.

9. The latch inverter as claimed in claim 1, wherein the latch inverter is applied to a double latch data flip-flop.

10. A latch inverter, comprising:
a first transistor, the gate of the first transistor receiving a data signal and the source of the first transistor connected to a voltage source;
a second transistor, the gate of the second transistor receiving a first trigger clock and the source of the second transistor connected to the drain of the first transistor;
a third transistor, the gate of the third transistor receiving a second trigger clock and the drain of the third transistor directly connected to the drain of the second transistor to generate an output signal;
a fourth transistor, the gate of the fourth transistor receiving the data signal, the drain of the fourth transistor directly connected to the source of the third transistor, and the source of the fourth transistor being grounded;
a fifth transistor, the gate of the fifth transistor receiving the data signal, the drain of the fifth transistor directly connected to the source of the second transistor, and the source of the fifth transistor being grounded; wherein the fifth transistor is used for providing the source of the second transistor with a first logic level;
a sixth transistor, the gate of the sixth transistor receiving the data signal, the source of the sixth transistor connected to a voltage source, and the drain of the sixth transistor directly connected to the drain of the fourth transistor; wherein the sixth transistor is used for providing the drain of the fourth transistor with a second logic level; wherein the drain of the fifth transistor and the drain of the sixth transistor are separated, and wherein the first and second trigger clocks are independent of the output signal.

11. The latch inverter as claimed in claim 10, wherein the second trigger clock is the inverted signal of the first trigger clock.

12. The latch inverter as claimed in claim 10, wherein the first and the second transistors are PMOS transistors, and the third and the fourth transistors are NMOS transistors.

13. The latch inverter as claimed in claim 10, wherein the first voltage level is changed to LOW by the fifth transistor when the voltage level of the data signal is HIGH.

14. The latch inverter as claimed in claim 10, wherein the fifth transistor is a NMOS transistor.

15. The latch inverter as claimed in claim 10, wherein the second voltage level is changed to HIGH by the sixth transistor when the voltage level of the data signal is LOW.

16. The latch inverter as claimed in claim 10, wherein the sixth transistor is a PMOS transistor.

17. The latch inverter as claimed in claim 10, wherein the latch inverter is applied to a flip-flop.

18. The latch inverter as claimed in claim 10, wherein the latch inverter is applied to a double latch data flip-flop.

* * * * *